United States Patent [19]

Leary et al.

[11] Patent Number: 4,494,172

[45] Date of Patent: Jan. 15, 1985

[54] HIGH-SPEED WIRE WRAP BOARD

[75] Inventors: Burton Leary, Hingham; Shaun Silverio, Beverly, both of Mass.

[73] Assignee: Mupac Corporation, Brockton, Mass.

[21] Appl. No.: 343,576

[22] Filed: Jan. 28, 1982

[51] Int. Cl.³ .............................................. H05K 1/02
[52] U.S. Cl. ................................... 361/400; 174/68.5; 361/307; 361/414
[58] Field of Search ............... 174/68.5; 361/414, 403, 361/402, 307, 400

[56] References Cited

U.S. PATENT DOCUMENTS

| | | | |
|---|---|---|---|
| 1,671,148 | 5/1928 | Deutschmann | 361/307 X |
| 3,250,848 | 5/1966 | Beelitz et al. | 174/68.5 |
| 3,324,224 | 6/1967 | Thibodeau | 174/35 |
| 3,344,515 | 10/1967 | Schuster et al. | 174/68.5 X |
| 3,351,816 | 11/1967 | Sear et al. | 174/68.5 X |
| 3,398,326 | 8/1968 | Swart et al. | 361/402 X |
| 3,568,000 | 3/1971 | D'Aboville | 317/101 |
| 3,680,005 | 7/1972 | Jorgeson et al. | 361/414 X |
| 3,895,435 | 7/1975 | Turner et al. | 29/625 |
| 3,932,932 | 1/1976 | Goodman | 361/414 X |
| 4,004,196 | 1/1977 | Doucet | 361/414 |
| 4,054,939 | 10/1977 | Ammon | 361/414 |
| 4,330,684 | 5/1982 | Hayward | 174/68.5 |
| 4,362,899 | 12/1982 | Borill | 174/36 |

FOREIGN PATENT DOCUMENTS 313636 1/1934 Italy ...................................... 361/307

Primary Examiner—R. R. Kucia

[57] ABSTRACT

A panel board has a first voltage layer sandwiched between two ground layers at a close spacing to produce a large distributed capacitance; the two ground layers are connected by plated-through conductive holes spaced regularly across the board; a second (exposed) voltage layer is connected by regularly spaced plated-through holes to the first voltage layer, increasing the current carrying capacity of, and reducing the resistance across, the board; the plated-through holes are arranged in rows and columns in a pattern permitting the mounting of decoupling capacitors, at any point on the board, in a position parallel to the rows or parallel to the columns; and a socket terminal can be electrically connected directly to the exposed voltage layer or to the exposed ground layer using a ring connector.

22 Claims, 11 Drawing Figures

HIGH-SPEED WIRE WRAP BOARD

BACKGROUND OF THE INVENTION

This invention relates to panel boards and socket terminals for mounting electronic components.

Multilayer panel boards for electronic components have sandwiches of conductive and insulative layers, one conductive layer carrying a voltage and one conductive layer being grounded. Wire-wrap socket terminals, which are held in mounting holes in the insulative layers, have sockets on one end for insertion of leads of electronic components and posts on the other end for wrapping wire to make connections.

SUMMARY OF THE INVENTION

In general, in one aspect, the invention features a multilayer panel board having a first electrically conductive layer, for carrying a first voltage, positioned between second and third electrically conductive layers for carrying a different second voltage, and first and second electrically insulative layers separating the first conductive layer from the second and third conductive layers by a distance small enough to produce a large distributed capacitance between the first conductive layer and the second and third conductive layers. In preferred embodiments, a fourth electrically conductive layer, positioned on the other side of the second conductive layer from the first conductive layer, also carries the first voltage, and is separated from the fourth conductive layer by a third insulating layer; the distance separating the first conductive layer from the second and third conductive layer is between about 0.005 inches and about 0.009 inches; the second voltage is at ground level; the large distributed capacitance is at least 0.02 microfarads; the first and fourth conductive layers are electrically connected by regularly spaced conductive voltage paths, and the second and third conductive layers are electrically connected by regularly spaced conductive ground paths, for increasing the current carrying capacity of the board, decreasing the resistance across the board, maintaining the second voltage uniformly at all points on said second and third conductive layers, and maintaining the first voltage uniformly at all points on said first and fourth conductive layers; the conductive paths are regularly distributed holes through the first, second, third and fourth conductive layers and through the first, second and third insulation layers of the board, with electrically conductive plating on the inside surfaces of the holes, the holes and plating for the second group of conductive paths being so arranged that the plating electrically contacts the first and fourth conductive layers and is electrically insulated from the second conductive layer, and the holes and plating for the first group of conductive paths being so arranged that the plating electrically contacts the second and third conductive layer and is electrically insulated from the first conductive layer; and the holes are arranged in rows and columns, every other hole in each row belonging to the first group of conductive paths and every intervening hole in the row belonging to the second group of conductive paths, every other hole in each of the columns belonging to the first group of conductive and every intervening hole in the column belonging to the second group of conductive paths, whereby any two-lead electronic component can be mounted anywhere on the board oriented parallel either to the rows or to the columns and with one of the leads connected to one of said first group of conductive paths and the other of the leads connected to one of said second group of conductive paths.

In another aspect, the invention features a panel board for holding electrical terminals, having an electrically conductive layer, an electrically insulative layer attached to the electrically conductive layer, the insulative layer having a number of round mounting holes for holding the terminals, the conductive layer having a number of round clearance holes corresponding to the mounting holes and coaxial with, and of slightly larger diameter than, the corresponding mounting holes, the clearance holes being spaced apart across said board, and the conductive layer extending across the spaces between the clearance holes, whereby inductance of the conductive layer is minimized and contact between the terminals and the conductive layer is prevented. In preferred embodiments, the difference in the diameter of each said clearance hole and the corresponding said mounting hole is less than 0.035 inches.

In another aspect, the invention features a combination for electrically connecting, without wiring, an electrical terminal mounted on a panel board to an electrically conductive layer of the board, the combination having an electrically insulative layer in the board, the insulative layer having a mounting hole for holding the terminal, a clearance hole in the electrical conductive layer, the clearance hole being coaxial with, and slightly larger than, the mounting hole for normally insulating the terminal from the conductive layer, and an electrically conductive ring connector positioned to electrically connect the terminal directly to the conductive layer. In preferred embodiments, the terminal has a shaft held in the mounting hole and a head or wire-wrap post projected beyond the insulative layer and the conductive layer, and the ring is mounted around the head in contact with the head and the conductive layer or around the post in contact with the post and the conductive layer.

The close spacing of a voltage layer between two ground layers provides a large distributed capacitance (without requiring many discrete isolation capacitors) which inhibits switching signals from causing voltage spikes in the power lines. Minimizing the diameters of the holes which must be cut through the voltage and ground layers to clear the mounted terminals improves the uniformity of voltage across each layer, reduces the inductance of the conductive layers, and improves the characteristic impedance of the board for high-frequency applications. Electrically tying together the ground layers and the voltage layers at many points distributed across the board assures a uniform voltage level at all points on each voltage layer and a uniform ground at all points on both ground layers, and also doubles the current carrying capacity of, and halves the resistance across, the board. The location of the plated-through holes close to the socket terminals enables discrete capacitors to be connected close to mounted integrated circuits. The pattern of grounded and powered plated-through holes permits the capacitors to be mounted sideways or lengthwise on the board. The close proximity of adjacent columns of socket terminals permits mounting components densely, thereby shortening the interconnection lead lengths. The ring connectors enable direct connection of the socket terminals to voltage and ground without using wire wrap connections (which hamper high-speed switching because of the inductance inherent in the lead length and lead wrapping). The board is able to handle high-speed logic circuits.

The socket terminals have large diameter heads, permitting easy insertion of component pins, but the contour of the connecting portion between the terminal head and terminal shaft prevents electrical short-circuit with the voltage layers. The top voltage layer or the bottom ground layer can be connected directly to any socket terminal using the ring connectors.

Other advantages and features of the invention will be apparent from the following description of the preferred embodiment, and from the claims.

DESCRIPTION OF THE PREFERRED EMBODIMENT

We turn now to the structure and operation of the preferred embodiment, first briefly describing the drawings thereof.

DRAWINGS

STRUCTURE

Figure 1:
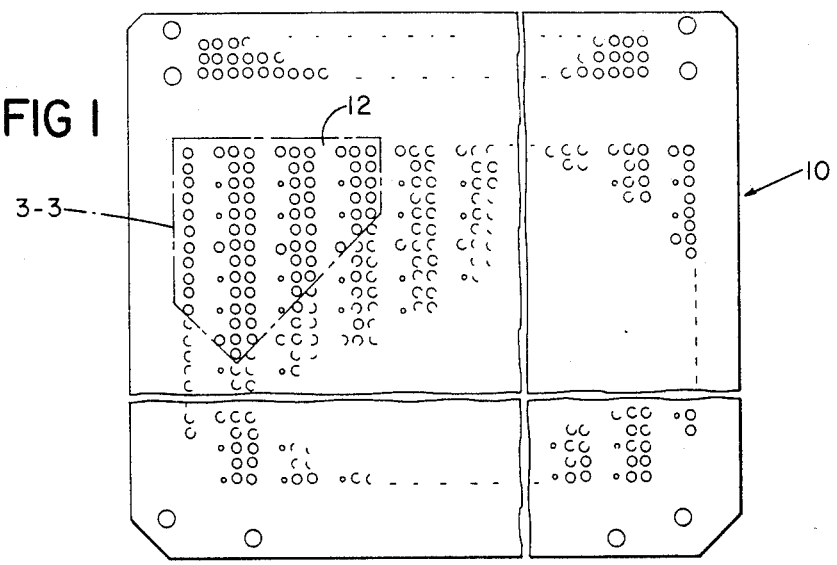
FIG. 1 is a broken plan view of the top of a multilayer panel board showing representative portions of a grid pattern of wire-wrap socket terminals and plated through holes.

Referring to FIG. 1, multilayer panel board 10 has a grid pattern 12 of wire-wrap socket terminals and plated-through holes for mounting and electrically interconnecting conventional integrated circuits contained in dual in-line packages (DIPs) and other components (not shown).

Figure 2:
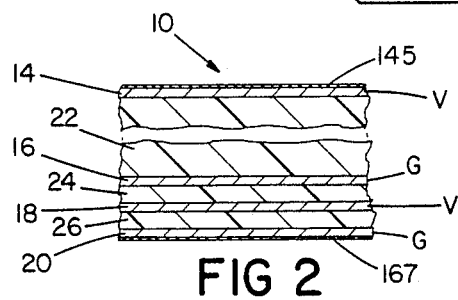
FIG. 2 is a greatly enlarged, broken sectional side view (at section A—A') of part of the board of FIG. 3.

Referring to FIG. 2, board 10 has two copper voltage plates 14, 18 connected to a source of voltage V (not shown) and two copper ground plates 16, 20 connected to ground (not shown). Plates 14, 16, 18, 20 are each preferably 0.0027" thick (preferred range 0.0025" to 0.0029") and are separated (as shown) by three layers 22, 24, 26 of glass epoxy. Epoxy layers 24, 26 are thin enough, preferably 0.008" thick (preferred range 0.005" to 0.009"), to establish a large distributed capacitance of about 0.03 microfarads between voltage plate 18 and ground plates 16, 20. Epoxy layer 22 is preferably 0.102" thick (preferred range 0.100" to 0.104").

Figure 3:
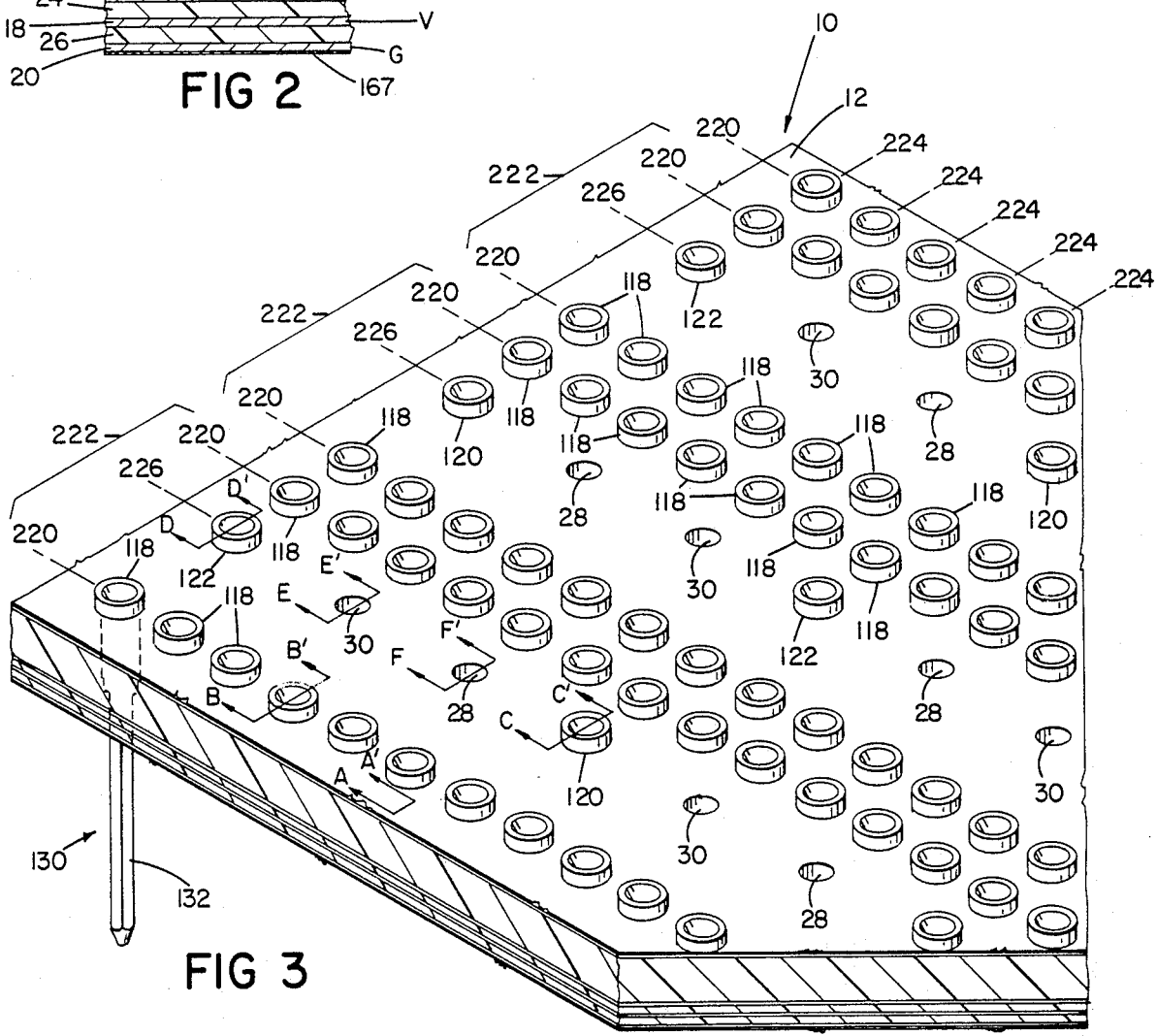
FIG. 3 is an enlarged isometric view of the indicated portion of the board of FIG. 1.

Referring to FIG. 3, voltage plates 14, 18 are electrically connected by plated-through voltage holes 28 (distributed regularly across board 10). Similarly, ground plates 16, 20 are electrically connected by plated-through ground holes 30 (also distributed regularly across board 10). All points on voltage plates 14, 18 are thus held at a uniform voltage V, while all points on ground plates 16, 20 are uniformly grounded. The current carrying capacity of the board is doubled and the resistance across the board is halved compared with boards having single voltage plates or single ground plates.

Figure 4:
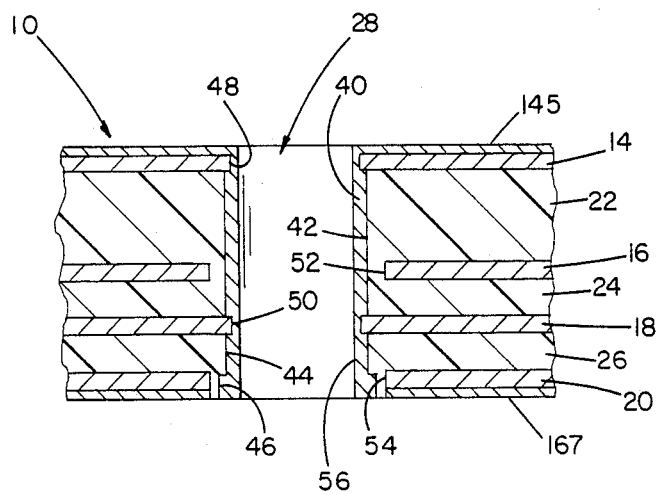
FIG. 4 is a greatly enlarged, sectional side view (at section F—F') of part of the board of FIG. 3, not to scale, showing a powered plated-through hole configuration.

Referring to FIG. 4, each plated-through voltage hole 28 has a sleeve 40 of copper plating which covers the inside of a hole comprising hole segments 42, 44, 46 in the epoxy and holes 48, 50 in voltage plates 14, 18. The diameters of holes 48, 50, preferably 0.041" (preferred range 0.039" to 0.043"), are smaller than the diameters of hole segments 42, 44, 46. Holes 52, 54 in ground plates 16, 20 are larger in diameter than hole segments 42, 46 and are preferably 0.087" (preferred range 0.085" to 0.090"). Sleeve 40 therefore electrically connects voltage plates 14, 18, but is electrically insulated from ground plates 16, 20. The inside hole 56 in sleeve 40 is preferably 0.037" in diameter (preferred range 0.034" to 0.040"). The copper plating of sleeve 40 extends across the surface of plate 14 (as shown), where it is approximately 0.003 inches thick.

Figure 5:
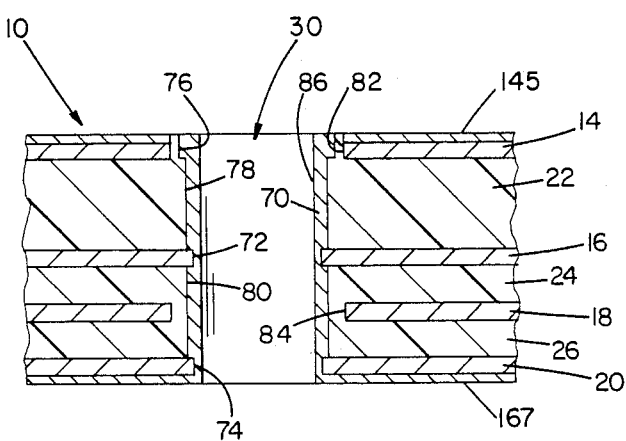
FIG. 5 is a greatly enlarged, sectional side view (at section E—E') of part of the board of FIG. 3, not to scale, showing a grounded plated-through hole configuration.

Referring to FIG. 5, each plated-through ground hole 30 similarly has copper-plated sleeve 70, which electrically connects ground plates 16, 20, but is electrically insulated from voltage plates 14, 18 (because the diameters of holes 72, 74 are smaller than diameters of hole segments 76, 78, 80, which are in turn small than the diameters of holes 82, 84). The copper plating of sleeve 70 extends across the surface of plate 20 (as shown), where it is approximately 0.003 inches thick. In their diameters, holes 72, 74 are similar to holes 48, 50; holes 82, 84 are similar to holes 52, 54; hole segments 76, 78, 80 are similar to hole segments 46, 44, 42; and hole 86 is similar to hole 56.

The densities of the plated-through ground holes and plated-through voltage holes are both approximately 4 holes per square inch across board 10.

Referring again to FIG. 3, grid pattern 12 has a regular arrangement (as shown) of plated-through voltage and ground holes 28, 30, and of wire-wrap socket terminals 118, 120, 122 mounted in holes (not shown) in board 10.

Figure 6:
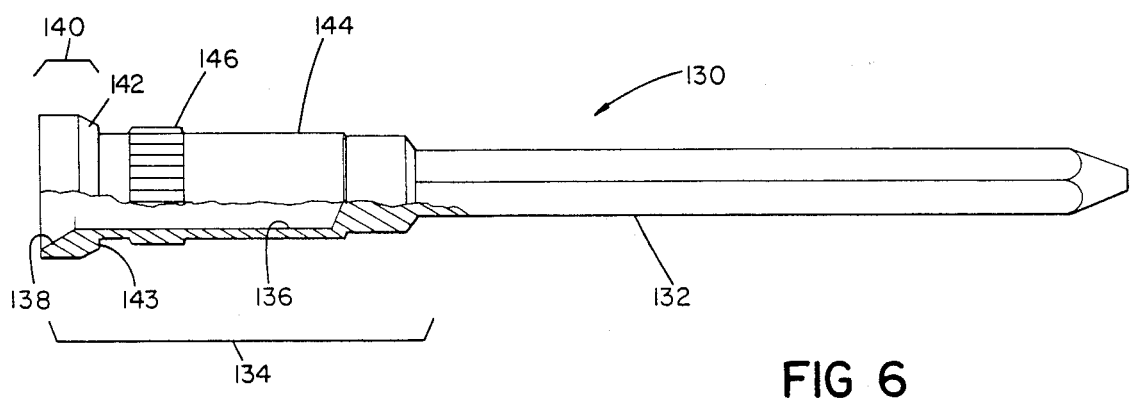
FIG. 6 is a greatly enlarged side view, partially cut away, of one of the wire-wrap socket terminals of FIG. 3.

Referring to FIG. 6, each wire-wrap socket terminal 130, fabricated of gold-over-nickel-plated, half-hard, yellow brass, has on one end a solid 0.025" square post 132 of a selected length (preferred range 0.350" to 0.550") to hold wrapped wire for making electrical connections. On the other end of terminal 130, round portion 134 has socket 136 opening to tapered portion 138 for easy insertion of a lead of a DIP or other component. Socket head 140 has tapered section 142 which tapers from a diameter of preferably 0.072" (preferred range 0.070" to 0.084") to a diameter of preferably 0.062" (preferred range 0.060" to 0.064"). Tapered section 142 ends at flat seat portion 143, which engages the surface of board 10 when terminal 130 is mounted. Shaft 144 rests in a hole in board 10 and knurled section 146 assures a tight interference fit in the hole. Tapered section 142 allows the use of a large diameter head 140, which enables easier insertion of component leads and pins. Alternatively, section 142 can be stepped or have any other contour which precludes a short-circuit between head 140 and plate 14 when terminal 130 is mounted in board 10.

Figure 7:
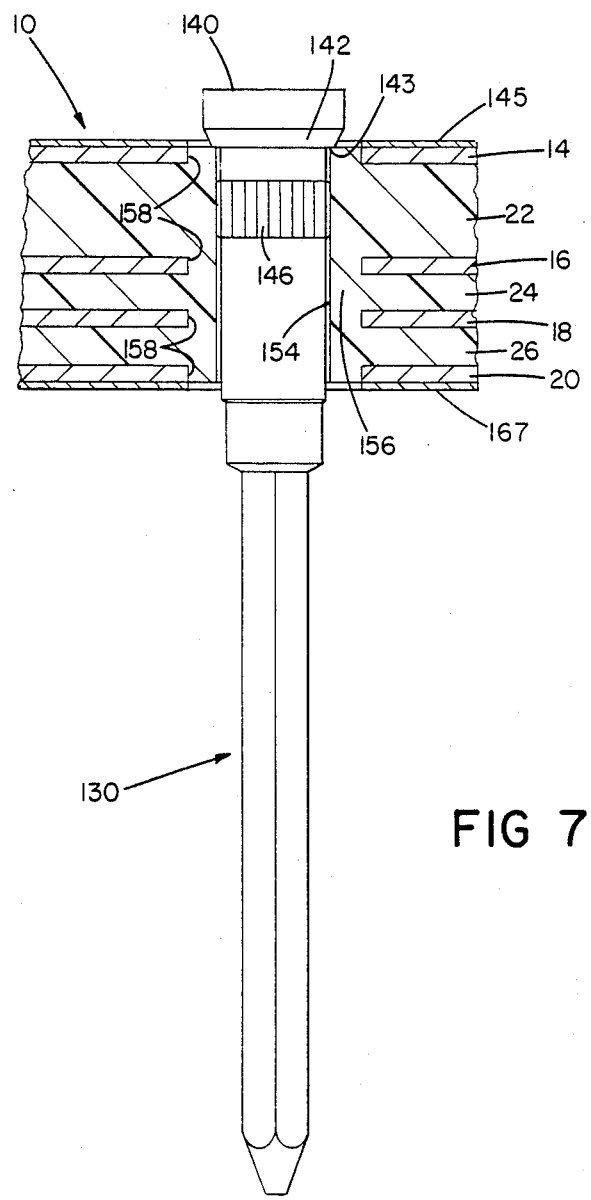
FIG. 7 is a greatly enlarged, sectional side view (at section B—B') of part of the board of FIG. 3, not to scale, showing a universal mounting configuration of the socket terminal of FIG. 6.
Figure 8:
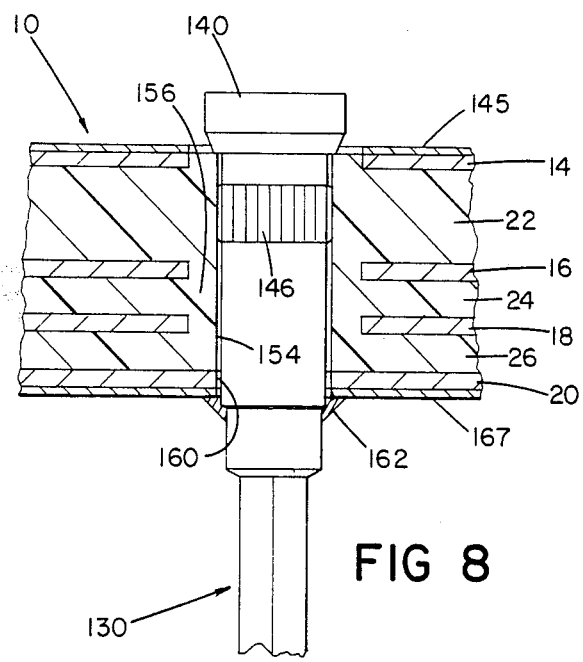
FIG. 8 is a greatly enlarged, sectional side view (at section C—C') of part of the board of FIG. 3, not to scale, showing a grounded mounting configuration of the socket terminal of FIG. 6.
Figure 9:
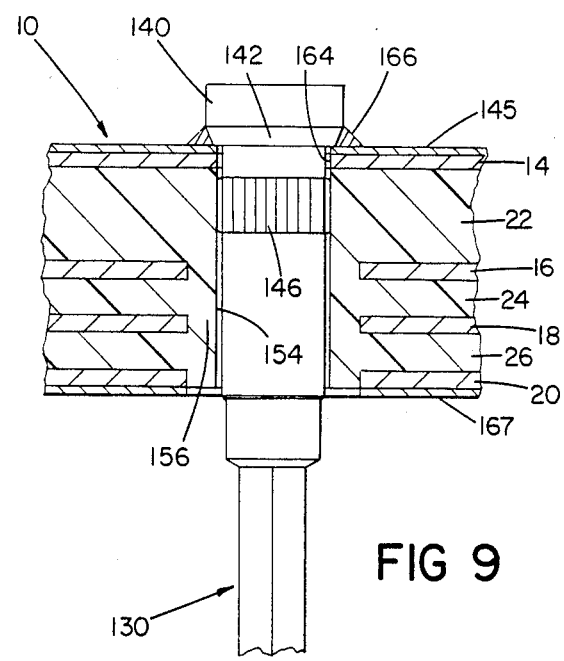
FIG. 9 is a greatly enlarged, sectional side view (at section D—D') of part of the board of FIG. 3, not to scale, showing a powered mounting configuration of the socket terminal of FIG. 6.

Each wire-wrap socket terminal 130 is mounted on board 10 in one of three different configurations: universal, grounded and powered. Referring to FIGS. 7, 8 and 9, in each of the three mounting configurations a wire-wrap socket terminal 130 is interference fitted into a hole 154 in board 10.

Referring to FIG. 7, in the universal mounting configuraton, hole 154, preferably of diameter 0.056" (preferred range 0.055" to 0.056") extends through an epoxy section 156 which spans the full thickness of board 10 and insulates terminal 130 from plates 14, 16, 18, 20, into which circular clearance holes 158, preferably of 0.087" diameter (preferred range 0.085" to 0.089") have been cut before fabrication of board 10. Seat portion 143 rests against epoxy section 156 and tapered section 142 prevents head 140 from short-circuiting against plate 14 or plating 145.

Referring to FIG. 8, the grounded mounting configuration is similar to the universal mounting configuration of FIG. 7, except that epoxy section 156 extends only to ground plate 20. Plate 20 has hole 160 preferably of diameter 0.056" (preferred range 0.055" to 0.056"), and terminal 130 touches and is electrically connected by solder 162 to ground plate 20.

Referring to FIG. 9, the powered mounting configuration is similar to the universal mounting configuration of FIG. 7, except that epoxy section 156 extends only from the bottom surface of plate 14. Plate 14 has hole 164, preferred range of diameter 0.056" (preferably 0.055" to 0.056"), and terminal 130 touches and is electrically connected by solder 166 to plate 14.

Figure 10:
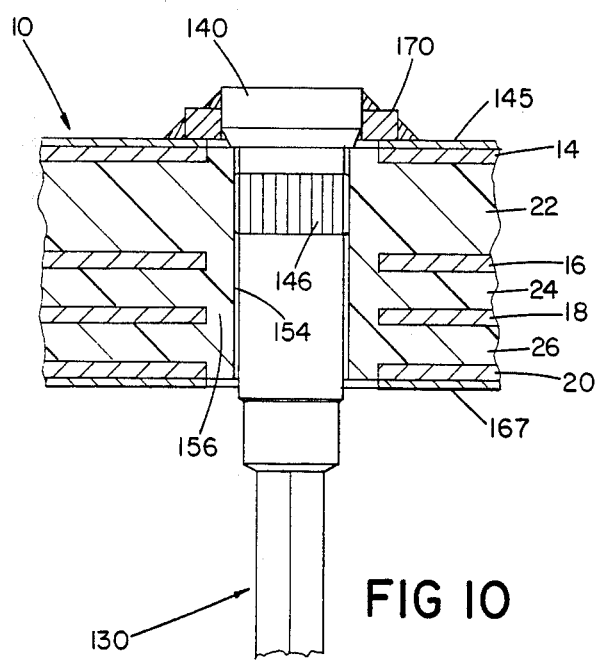
FIG. 10 is a greatly enlarged, sectional side view of part of the board of FIG. 3, not to scale, showing a powered universal socket terminal.
Figure 11:
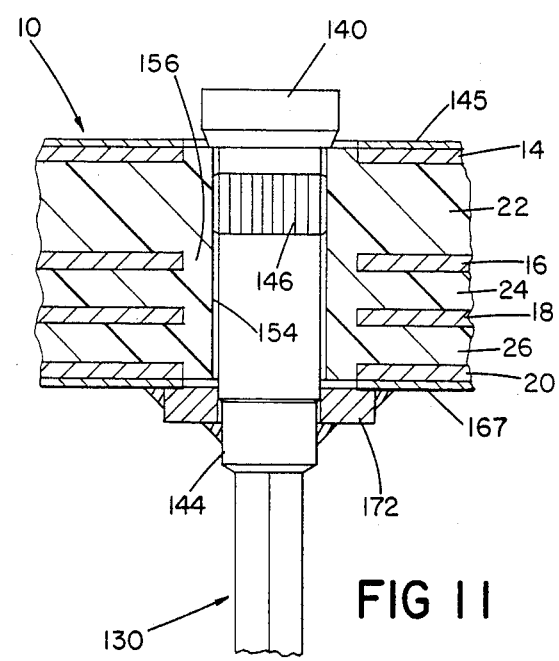
FIG. 11 is a greatly enlarged, sectional side view of part of the board of FIG. 3, not to scale, showing a grounded universal socket terminal.

Referring to FIG. 10, any terminal 130, mounted in the universal configuration, can be connected to voltage V (without requiring a wire-wrapped connection) by soldering copper ring 170 to head 140 and plating 145. Similarly, referring to FIG. 11, any universal terminal 130, mounted in the universal configuration, can be directly connected to ground (without requiring a wire-wrapped connection) by soldering copper ring 172 both to shaft 144 and plating 167.

Referring again to FIG. 3, in grid pattern 12, universal terminals 118 are arranged in columns 220. Columns 220 are in turn associated in pairs 222; in each pair 222, the two columns 220 are preferably 0.300" apart (preferred range 0.297" to 0.303"). Adjacent pairs 222 are preferably 0.100" apart (preferred range 0.097" to 0.103"). In each column 220, adjacent universal terminals 118 are preferably 0.100" apart (preferred range 0.097" to 0.103"), and are aligned (with corresponding universal terminals in the other columns 220) to form rows 224. Between each of the two columns 220 of each pair 222 is an intermediate column 226 having grounded plated-through holes 30, powered plated-through holes 28, grounded wire-wrap socket terminals 120 and powered wire-wrap socket terminals 122 arranged as shown. Each intermediate column 226 is spaced preferably 0.100" (preferred range 0.907" to 0.103") from one adjacent column 220 and preferably 0.200" (preferred range 0.197" to 0.203") from the other adjacent column 220. Alternate intermediate columns 226 have one arrangement of terminals and plated-through holes and the remaining intermediate columns 226 have a second arrangement as shown. The spacing between the columns 220 in each pair 222 is chosen to suit the pin spacing of conventional DIPs, while the spacing between pairs 222 is minimized to maximize the density of DIPs mounted on board 10.

The location of each intermediate columnn 226 and the locations of the powered and grounded wire-wrap socket terminals 120, 122 within each column 226 enable the mounting of discrete decoupling capacitors (not shown) oriented either in the direction of columns 220 or in the direction of rows 224; and a capacitor can be positioned immediately adjacent to any DIP mounted on board 10.

MANUFACTURE AND OPERATION

In fabricating board 10, glass epoxy core stock (faced on both sides with copper foil) becomes layer 24 with plates 16, 18. Plate 16 is imaged, printed and etched to form clearance holes 52; and plate 18 is imaged, printed and etched to form clearance holes 84. A second piece of glass epoxy core stock (faced on one side with copper foil) is laminated to plate 18 to form layer 26 and plate 20; and a third piece of glass epoxy core stock (faced on one side with copper foil) is laminated to plate 16 to form layer 22 and plate 14. Plates 14 and 20 are then imaged, printed and etched to form all of the holes 48, 54, 74, 82, 158, 160, and 164. The laminated assembly is then drilled through in the locations where the plated-through holes are to appear, using a drill having the same diameter as desired holes 50 and 72. The exposed copper portions of the laminated assembly are coated with an acid resistive substance, and the glass epoxy in the drilled holes is etched back to diameters 48 and 42, exposing parts of plates 14, 16, 18 and 20 around holes 48, 50, 72 and 74. The acid resist is removed and the holes are plated through. Socket terminal holes 154 are drilled through. The panel is imaged, printed and etched, and subjected to electroplating, ink screening and routing to final shape.

In use, DIPs and other components are mounted on the top of board 10 by inserting their leads into appropriately selected socket terminals 118, 120, 122, or are connected underneath board 10 by wrapping their leads around posts 132 of socket terminals 118, 120, 122. Wired connections between terminals 118, 120, 122 are made by wire-wrapping around posts 132. Voltage V is connected to plates 14, 18; plates 16, 20 are grounded.

Any component pin inserted in, or wire wrapped around any terminal 120 is automatically grounded; any component pin inserted in, or wire wrapped around, any terminal 122 is automatically powered at voltage V. In addition, any universal terminal 118 can be directly grounded or connected to voltage V by installing a soldered ring 172 or 170, respectively.

Other embodiments are within the following claims.

We claim:
1. A multilayer panel board comprising
   a first electrically conductive layer extending across said board for carrying a first voltage to a plurality of points across said board, second and third electrically conductive layers for carrying a second voltage different from said first voltage, said first conductive layer being positioned between said second and third conductive layers, first and second electrically insulative layers separating said first conductive layer respectively from said second and third conductive layers by a distances small enough to produce a large distributed capacitance between said first conductive layer and said second and third conductive layers, a fourth electrically conductive layer extending across said board for carrying said first voltage, said fourth conductive layer being positioned on the other side of said second conductive layer from said first conductive layer.

a third electrically insulative layer separating said fourth conductive layer from said second conductive layer, and a plurality of electrical connections between said first and fourth conductive layers, and between said second and third conductive layers, said electrical connections being distributed regularly across said board, for increasing the current carrying capacity of, and for enhancing the uniformity of said first and second voltages across, said board.

2. The board of claim 1 wherein said electrical connections comprise a first group of conductive paths connecting said second and third conductive layers through said first and second insulative layers and through said first conductive layer, said first group of conductive paths being electrically insulated from said first conductive layer, said first group of conductive paths being located at a number of spaced-apart points across said board, whereby said second voltage is maintained uniformly across said second and third conductive layers.

3. The board of claim 2 wherein said electrical connections further comprise a second group of conductive paths connecting said first and fourth conductive layers through said first and third insulative layer and said second conductive layer, said second group of conductive paths being electrically insulated from said second conductive layer, said second group of conductive paths being located at a number of spaced-apart points across said board.

whereby said first voltage is maintained uniformly at all points on said first and fourth conductive layers.

4. The board of claim 3 wherein said conductive paths comprise holes through said board, each of said holes comprising coaxial hole segments through said first, second, third and fourth conductive layers and through said first, second and third insulative layers, and electrically conductive plating on the inside surfaces of said hole segments, said hole segments and said plating for said second group of conductive paths being so arranged that said plating electrically contacts said first and fourth conductive layers and is electrically insulated from said second conductive layer, and said hole segments and said plating for said first group of conductive paths being so arranged that said plating electrically contacts said second and third conductive layer and is electrically insulated from said first conductive layer.

5. The board of claim 1 wherein said holes are arranged in rows and columns, every other said hole in each of said rows belonging to said first group of conductive paths and every intervening said hole in said row belonging to said second group of conductive paths, and every other said hole in each of said columns belonging to said first group of conductive paths and every intervening said hole in said column belonging to said second group of conductive paths, whereby any two-lead electronic component can be mounted anywhere on said board oriented parallel either to said rows or to said columns and with one of said leads connected to one of said first group of conductive paths and the other one of said leads connected to one of said second group of conductive paths.

6. The board of claim 1 wherein said insulative layers have a number of mounting holes for holding electrical terminals, and one of said conductive layers has a number of clearance holes corresponding to said mounting holes, and each of said clearance holes is coaxial with, and of slightly larger diameter than, the corresponding one of said mounting holes, said clearance holes being spaced apart across said board, said conductive layer extending across the spaces between said clearance holes, thereby defining and surrounding the clearance holes, whereby the inductance of said conductive layer is minimized while contact between said terminals and said conductive layer is prevented.

7. The board of claim 6 further comprising an electrically conductive ring connector coaxial with one said mounting hole, said ring connector overlying said conductive layer and a portion of said insulative layer exposed through said clearance hole associated with said one mounting hole to electrically connect a terminal mounted in said mounting hole directly to said conductive layer.

8. The board of claim 7 further comprising a terminal having a shaft held in said one mounting hole and a head projecting over said insulative layer, and wherein said ring connector is mounted around said head in contact with said head and said conductive layer.

9. The board of claim 7 further comprising a terminal having a shaft held in said one mounting hole and a post for receiving connections, said post projecting beyond said insulative layer, and wherein said ring connector is mounted around said post in contact with said post and said conductive layer.

10. The board of claim 6 wherein the difference in the diameter of each said clearance hole and the corresponding said mounting hole is less than 0.035 inches.

11. A multilayer panel board comprising a first electrically conductive layer extending across said board for carrying a first voltage to a plurality of points across said board, second and third electrically conductive layers for carrying a second voltage different from said first voltage, said first conductive layer being positioned between said second and third conductive layers, first and second electrically insulative layers separating said first conductive layer respectively from said second and third conductive layers by distances small enough to produce a large distributed capacitance between said first conductive layer and said second and third conductive layers, a fourth electrically conductive layer extending across said board for carrying said first voltage, said fourth conductive layer being positioned on the other side of said second conductive layer from said first conductive layer, a third electrically insulative layer separating said fourth conductive layer from said second conductive layer, electrical connections, between said first and fourth conductive layers and between said second and third conductive layers, for increasing the current carrying capacity of, and decreasing the resistance across, said board, and an array of electrical connector elements at spaced apart locations across said board, each of said elements being connectable at its said location selectively either to said third conductive layer or to said fourth conductive layer.

12. The board of claim 11 wherein said electrical connector elements comprise terminals mounted in an array of holes through said board, said holes being arranged to insulate said terminals from said conductive layers.

13. The board of claim 12 wherein said elements are each connectable to said third or fourth conductive layer by electrical bridging.

14. The board of claim 13 wherein said electrical bridging comprises a conductive ring.

15. The board of claim 1 or 11 wherein said distance is between about 0.005 inches and about 0.009 inches.

16. The board of claim 1 or 11 wherein said second voltage is at ground level.

17. The board of claim 1 or 11 wherein said large distributed capacitance is at least 0.02 microfarads.

18. The board of claim 1 or 11 wherein said electrical connections comprise a plurality of conductive ground paths and conductive voltage paths through said board.

19. The board of claim 18 wherein each said ground path is spaced no more than 0.8" from the closest adjacent ground path.

20. The board of claim 18 wherein each said voltage path is spaced no more than 0.8" from the closest adjacent voltage path.

21. The board of claim 18 wherein the density of said ground paths across said board is at least 3 paths per square inch.

22. The board of claim 18 wherein the density of said voltage paths across said board is at least 3 paths per square inch.

* * * * *

UNITED STATES PATENT AND TRADEMARK OFFICE
CERTIFICATE OF CORRECTION

PATENT NO. : 4,494,172
DATED : January 15, 1985
INVENTOR(S) : Burton Leary, et al.

It is certified that error appears in the above-identified patent and that said Letters Patent are hereby corrected as shown below:

Column 4, line 44, "small" is corrected to read --smaller--;

Column 7, line 8, "a" is deleted;

Column 8, line 3, "1" is corrected to read --4--.

Signed and Sealed this

Twenty-eighth Day of May 1985

[SEAL]

Attest:

DONALD J. QUIGG

Attesting Officer    Acting Commissioner of Patents and Trademarks